United States Patent
Kiehl et al.

(10) Patent No.: US 10,601,371 B2
(45) Date of Patent: Mar. 24, 2020

(54) PHASE-LOCKED SPIN TORQUE OSCILLATOR ARRAY

(71) Applicants: Arizona Board of Regents on behalf of Arizona State University, Scottsdale, AZ (US); Richard Arthur Kiehl, Phoenix, AZ (US); Nicholas Rizzo, Gilbert, AZ (US)

(72) Inventors: Richard Arthur Kiehl, Phoenix, AZ (US); Nicholas Rizzo, Gilbert, AZ (US)

(73) Assignee: Arizona Board of Regents on behalf of Arizona State University, Scottsdale, AZ (US)

( * ) Notice: Subject to any disclaimer, the term of this patent is extended or adjusted under 35 U.S.C. 154(b) by 0 days.

(21) Appl. No.: 16/097,796

(22) PCT Filed: May 5, 2017

(86) PCT No.: PCT/US2017/031292
§ 371 (c)(1),
(2) Date: Oct. 30, 2018

(87) PCT Pub. No.: WO2017/192986
PCT Pub. Date: Nov. 9, 2017

(65) Prior Publication Data
US 2019/0173428 A1 Jun. 6, 2019

Related U.S. Application Data

(60) Provisional application No. 62/332,337, filed on May 5, 2016.

(51) Int. Cl.
*H01S 1/06* (2006.01)
*H03B 17/00* (2006.01)
(Continued)

(52) U.S. Cl.
CPC ......... *H03B 15/006* (2013.01); *H01F 10/329* (2013.01); *H01F 41/302* (2013.01);
(Continued)

(58) Field of Classification Search
CPC ..... H03B 15/006; H03B 15/00; H01F 10/329; H01F 41/302; H01L 43/06; H01L 43/10; H01L 43/14
(Continued)

(56) References Cited

U.S. PATENT DOCUMENTS 2,815,488 A 12/1957 Neumann
6,162,532 A * 12/2000 Black .................. B82Y 25/00
427/128
(Continued)

OTHER PUBLICATIONS

Alexander et al. "CMOS-compatible spintronic devices: a review," Semiconductor Science and Technology, 31, 113006, (2016).
(Continued)

*Primary Examiner* — Richard Tan
(74) *Attorney, Agent, or Firm* — Fish & Richardson P.C.

(57) ABSTRACT

An array of magnetic nanoparticle (MNP) spin torque oscillators (STOs) is described. Each STO is comprised of a uniform, chemically synthesized, spherical nanoparticle which couples to current flowing along a surface. The particles are organized into an array by a self-assembly technique with uniform spacing and close proximity to allow strong electrical and magnetic coupling between particles. The coupling of the nanoparticles to the surface current drives the oscillations by spin-torque, and for phase locking and data input. The uniform, spherical shape of the particles allows the oscillations to be achieved at low currents and with low power dissipation. The MNP-STOs may be used as a basis for massively parallel computing, microwave oscillators, or other applications.

13 Claims, 4 Drawing Sheets

(51) Int. Cl.
  H03B 15/00 (2006.01)
  H01F 10/32 (2006.01)
  H01F 41/30 (2006.01)
  H01L 43/06 (2006.01)
  H01L 43/10 (2006.01)
  H01L 43/14 (2006.01)
(52) U.S. Cl.
  CPC .............. *H01L 43/06* (2013.01); *H01L 43/10* (2013.01); *H01L 43/14* (2013.01); *H03B 15/00* (2013.01)
(58) Field of Classification Search
  USPC .......................................................... 331/94
  See application file for complete search history.

(56) References Cited

U.S. PATENT DOCUMENTS

| | | | |
|---|---|---|---|
| 6,716,525 B1* | 4/2004 | Yadav .................... | A61L 27/06 428/402 |
| 9,449,618 B2 | 9/2016 | Rivkin | |
| 2009/0047485 A1* | 2/2009 | Ofir .................... | B81C 1/00031 428/206 |
| 2009/0115541 A1 | 5/2009 | Persson et al. | |
| 2010/0039105 A1 | 2/2010 | Ryan et al. | |
| 2014/0168812 A1 | 6/2014 | Braganca et al. | |
| 2015/0372687 A1 | 12/2015 | Buhrman et al. | |
| 2016/0013754 A1 | 1/2016 | Shin et al. | |

OTHER PUBLICATIONS

Alos-Palop et al. "Adiabatic quantum pumping through surface states in 3D topological insulators," New Journal of Physics, 14, 113003 (2012).
Bae et al. "Experimental studies of strong dipolar interparticle interaction in monodisperse Fe3O4 nanoparticles," Applied Physics Letters, 91, 102502, (2007).
Baker et al. "Magnetic proximity-enhanced Curie temperature of Cr-doped Bi2Se3 thin films," Physical Review B, 92, 094420 (2015).
Baker et al. "Proposal of a micromagnetic standard problem for ferromagnetic resonance simulations", Journal of Magnetism and Magnetic Materials, vol. 421, p. 428-439, DOI: 10.1016/j.jmmm.2016.08.009, Jan. 2017.
Baker et al. "Spin pumping in Ferromagnet-Topological Insulator-Ferromagnet Heterostructures," Scientific Reports, 5, 7907 (2015).
Bedanta et al. "Supermagnetism," Journal of Physics D—Applied Physics, 42, 013001 (2009).
Bonetti et al. "Spin torque oscillator frequency versus magnetic field angle: The prospect of operation beyond 65 GHz," Applied Physics Letters, 94, 102507 (2009).
Braganca et al. "Nanoscale magnetic field detection using a spin torque oscillator," Nanotechnology, 21, 235202, (2010).
Bulusu et al. "Efficient Modification of Metal Oxide Surfaces with Phosphoric Acids by Spray Coating," Langmuir, 29, 3935-3942 (2013).
Can et al. "Domain state-dependent magnetic formation of Fe3O4 nanoparticles analyzed via magnetic resonance," Journal of Nanoparticle Research, 13, 5497, (2011).
Cao et al. "Injection Locking of Spin-Torque Nano-Oscillators," IEEE Transactions on Magnetics, 50, 1-3, (2014).
Chamberlin et al. "Magnetic relaxation of iron nanoparticles," Journal of Applied Physics, 91, 6961-6963 (2002).
Chamberlin et al. "Percolation, relaxation halt, and retarded van der Waals interaction in dilute systems of iron nanoparticles," Physical Review B, 66, 172403 (2002).
Chamberlin et al. "Saturation and intrinsic dynamics of fluxons in NbTi and MgB2," Applied Physics Letters, 90, 132504 (2007).
Chen et al. "Spin-Torque and Spin-Hall Nano-Oscillators," Proceedings of the IEEE, 104, 10, DOI: 10.1109/JPROC.2016.2554518, Oct. 2016.
Collins-McIntyre et al. "Growth of Bi2Se3 and Bi2Te3 on amorphous fused silica by MBE," Physica Status Solidi B—Basic Solid State Physics, 252, 1334-1338 (2015).
Collins-McIntyre et al. "Magnetic ordering in Cr-doped Bi2Se3 thin films," Epl, 107, 57009(2014).
Collins-McIntyre et al. "X-ray magnetic spectroscopy of MBE-grown Mn-doped Bi2Se3 thin films," Aip Advances, 4, 127136 (2014).
Csaba et al. "Computational Study of Spin-Torque Oscillator Interactions for Non-Boolean Computing Applications," IEEE Transactions on Magnetics, 49, 4447-4451 (2013).
Daniela et al. "Magnetic properties of variable-sized Fe 3 O 4 nanoparticles synthesized from non-aqueous homogeneous solutions of polyols," Journal of Physics D: Applied Physics, 40, 5801, (2007).
Dankert et al. "Room Temperature Electrical Detection of Spin Polarized Currents in Topological Insulators," Nano Letters, 15, 7976-7981 (2015).
Deac et al. "Bias-driven high-power microwave emission from MgO-based tunnel magnetoresistance devices," Nature Physics, 4, 803-809 (2008).
Dong et al. "Binary nanocrystal superlattice membranes self-assembled at the liquid-air interface," Nature, 466, 474-7 (2010).
Fan et al. "Injection-Locked Spin Hall-Induced Coupled-Oscillators for Energy Efficient Associative Computing," IEEE Transactions on Nanotechnology, 14, 1083-1093 (2015).
Figueroa et al. "Local Structure and Bonding of Transition Metal Dopants in Bi2Se3 Topological Insulator Thin Films," Journal of Physical Chemistry C, 119, 17344-17351 (2015).
Figueroa et al. "Magnetic Cr doping of Bi2Se3: Evidence for divalent Cr from x-ray spectroscopy," Physical Review B, 90, 134402 (2014).
Gliboff et al. "Competing Effects of Fluorination on the Orientation of Aromatic and Aliphatic Phosphonic Acid Monolayers on Indium Tin Oxide," J. Phys. Chem. C, 117, 15139-15147, (2013).
Greaves et al. "Microwave-Assisted Magnetic Recording on Dual-Thickness and Dual-Layer Bit-Patterned Media," IEEE Transactions on Magnetics, 52, 1-4, (2016).
Harrison et al. "Catalyst-free growth of Bi2Te3 nanostructures by molecular beam epitaxy," Applied Physics Letters, 105, 153114 (2014).
Harrison et al. "Massive Dirac Fermion Observed in Lanthanide-Doped Topological Insulator Thin Films," Scientific Reports, 5, 15767 (2015).
Harrison et al. "Preparation of layered thin film samples for angle-resolved photoemission spectroscopy," Applied Physics Letters, 105, 121608 (2014).
Harrison et al. "Study of Dy-doped Bi2Te3: thin film growth and magnetic properties," Journal of Physics—Condensed Matter, 27, 245602 (2015).
Harrison et al. "Study of Gd-doped Bi2Te3 thin films: Molecular beam epitaxy growth and magnetic properties," Journal of Applied Physics, 115, 023904 (2014).
Harrison et al. "Study of Ho-doped Bi2Te3 topological insulator thin films," Applied Physics Letters, 107, 182406 (2015).
Haugen et al. "Spin transport in proximity-induced ferromagnetic graphene," Physical Review B, 77, 115406 (2008).
Hill et al. "Colloidal Polymers from Dipolar Assembly of Cobalt-Tipped CdSe@CdS Nanorods," ACS Nano, 8, 3272-3284 (2014).
Hill et al. "Colloidal Polymers via Dipolar Assembly of Magnetic Nanoparticle Monomers," ACS Appl. Mater. Interfaces, 6, 6022-6032 (2014).
Hill et al. "Directing the Deposition of Ferromagnetic Cobalt onto Pt-Tipped CdSe@CdS Nanorods: Synthetic and Mechanistic Insights," ACS Nano, 6, 8632-8645 (2012).
Horvath et al. "Synchronization in cellular spin torque oscillator arrays," DOI: 10.1109/CNNA.2012.6331453 Cellular Nanoscale Networks and Their Applications (CNNA), 13th International Workshop on. Aug. 29-31, 2012.

(56) References Cited

OTHER PUBLICATIONS

Hotchkiss et al. "The Modification of Indium Tin Oxide with Phosphoric Acids: Mechanism of Binding, Tuning of Surface Properties, and Potential for Use in Organic Electronic Applications," Acc. Chem. Res., 45, 337-346 (2012).
Houshang et al. "Spin-wave-beam driven synchronization of nanocontact spin-torque oscillators," Nat Nano, 11, 280-286, (2016).
Ju et al. "High Density Heat-Assisted Magnetic Recording Media and Advanced Chamcterization—Progress and Challenges," IEEE Transactions on Magnetics, 51, 3201709 (2015).
Kaka et al. "Mutual phase-locking of microwave spin torque nano-oscillators," Nature, 437, 389-392 (2005).
Katine et al. "Device implications of spin-transfer torques," Journal of Magnetism and Magnetic Materials, 320, 1217-1226 (2008).
Keng et al. "Colloidal Polymerization of Polymer-Coated Ferromagnetic Cobalt Nanoparticles into Pt—Co3O4 Nanowires," Chem. Mater., 23, 1120-1129 (2011).
Keng et al. "Colloidal Polymerization of Polymer-Coated Ferromagnetic Nanoparticles into Cobalt Oxide Nanowires," ACS Nano, 3, 3143-3157 (2009).
Keng et al. "Synthesis and self-assembly of polymer-coated ferromagnetic nanoparticles," ACS Nano, 1, 279-292 (2007).
Khanna "State of the art in microwave VCOs," Microwave Journal, 58, 22-42, (2015).
Kim et al. "Generation Linewidth of an Auto-Oscillator with a Nonlinear Frequency Shift: Spin-Torque Nano-Oscillator," Physical Review Letters, 100, 017207 (2008).
Kim et al. "Synthesis and Colloidal Polymerization of Ferromagnetic Au—Co Nanoparticles into Au—Co3O4 Nanowires," J. Am. Chem. Soc., 132, 3234-3235 (2010).
Knesting et al. "ITO Interface Modifiers Can Improve open-circuit voltage in Polymer Solar Cells and Suppress Surface Recombination," J. Phys. Chem. Lett., 4, 4038-4044, (2013).
Knesting et al. "Spatially Modulating Interfacial Properties of Transparent Conductive Oxides: Patterning Work Function with Phosphoric Acid Self-Assembled Monolayers," Adv. Mater. (Weinheim, Ger.), 24, 642-646 (2012).
Laroze et al. "Dynamics of two interacting dipoles," Journal of Magnetism and Magnetic Materials, 320, 1440-1448 (2008).
Le "DNA-templated self-assembly of metallic nanocomponent arrays on a surface," Nano Letters, 4, 2343-2347 (2004).
Li et al. "Magnetic properties of gadolinium substituted Bi2Te3 thin films," Applied Physics Letters, 102, 242412 (2013).
Li et al. "Modification of the Gallium-Doped Zinc Oxide Surface with Self-Assembled Monolayers of Phosphoric Acids: A Joint Theoretical and Experimental Study," Adv. Funct. Mater., 24, 3593-3603 (2014).
Lima et al. "Spin disorder and magnetic anisotropy in Fe3O4 nanoparticles," Journal of Applied Physics, 99, 083908, (2006).
Macià et al. "Spin wave excitation patterns generated by spin torque oscillators," Nanotechnology, 25, 045303 (2014).
Mancoff et al. "Area dependence of high-frequency spin-transfer resonance in giant magnetoresistance contacts up to 300 nm diameter," Applied Physics Letters, 88, 112507 (2006).
Mancoff et al. "Phase-locking in double-point-contact spin-transfer devices," Nature, 437, 393-395 (2005).
Meric et al. "Channel Length Scaling in Graphene Field-Effect Transistors Studied with Pulsed Current-Voltage Measurements," Nano Letters, 11, 1093-1097, (2011).
Mizushima et al. "Signal-to-noise ratios in high-signal-transfer-rate read heads composed of spin-torque oscillators," Journal of Applied Physics, 107, 063904, (2010).
Nikonov et al. "Coupled-Oscillator Associative Memory Array Operation for Pattern Recognition", IEEE Journal on Exploratory Solid-State Computational Devices and Circuits, vol. 1, pp. 85-93, Nov. 25, 2015.
Paniagua et al. "Surface-Initiated Polymerization from Barium Titanate Nanoparticles for Hybrid Dielectric Capacitors," ACS Appl. Mater. Interfaces, 6, 3477-3482 (2014).
Pardavi-Horvath "Interaction effects in magnetic nanostructures," Physica Status Solidi a—Applications and Materials Science, 211, 1030-1040 (2014).
Park et al. "Ultra-large-scale syntheses of monodisperse nanocrystals," Nat. Mater., 3, 891-895 (2004).
PCT International Search Report and Written Opinion in International Appln. No. PCT/US2017/031292, dated Jul. 11, 2017. 10 pages.
Pike "First-order reversal-curve diagrams and reversible magnetization," Physical Review B, 68, 104424, (2003).
Pinto et al. "Sequence-encoded self-assembly of multiple-nanocomponent arrays by 2D DNA scaffolding," Nano Letters, 5, 2399-2402 (2005).
Piramanayagam et al. "Influence of magnetic viscosity on the first order reversal curves of antiferromagnetically coupled perpendicular recording media," Journal of Applied Physics, 111, 07B728, (2012).
Piramanayagam et al. "Magnetic and First-Order Reversal Curve Investigations of Antiferromagnetically Coupled Nanostructures of Co/Pd Multilayers," IEEE Transactions on Magnetics, 48, 3410-3413, (2012).
Power et al. "Dynamic RKKY interaction in graphene," Physical Review B, 85, 195411 (2012).
Puntes et al. "Colloidal nanocrystal shape and size control: The case of cobalt," Science (Washington, DC, United States), 291, 2115-2117 (2001).
Pyun et al. "Synthesis and characterization of organic/inorganic hybrid nanoparticles: kinetics of surface-initiated atom transfer radical polymerization and morphology of hybrid nanoparticle ultrathin films," Macromolecules, 36, 5094-5104, (2003).
Pyun et al. "Synthesis of polymer brushes using atom transfer radical polymerization," Macromol. Rapid Commun., 24, 1043-1059, (2003).
Qu et al. "Phase-Lock Requirements in a Serial Array of Spin Transfer Nano-Oscillators," Scientific Reports, 5, 11462 (2015).
Rife et al. "Design and performance of GMR sensors for the detection of magnetic microbeads in biosensors," Sensors and Actuators A: Physical, 107, 209-218, (2003).
Rippard et al. "Current-driven microwave dynamics in magnetic point contacts as a function of applied field angle," Physical Review B, 70, 100406(R) (2004).
Rippard et al. "Injection Locking and Phase Control of Spin Transfer Nano-oscillators," Physical Review Letters, 95, 067203, (2005).
Rizzo et al. "A Fully Functional 64 Mb DDR3 ST-MRAM Built on 90 nm CMOS Technology," IEEE Transactions on Magnetics, 49, 4441-4446 (2013).
Roy et al. "Exploring Boolean and non-Boolean computing with spin torque devices". In Proceedings of the International Conference on Computer-Aided Design. 2013, IEEE Press: San Jose, California. p. 576-580.
Salvin et al. "Theory of mutual phase locking of spin-torque nanosized oscillators," Physical Review B, 74, 104401 (2006).
Sang et al. "PM-IRRAS Determination of Molecular Orientation of Phosphonic Acid Self-Assembled Monolayers on Indium Zinc Oxide," Langmuir, 31, 5603-5613 (2015).
Sani et al. "Mutually synchronized bottom-up multi-nanocontact spin-torque oscillators," Nature Communications, 4, 2731, (2013).
Savin et al. "Synthesis and characterization of silica-graft-polystyrene hybrid nanoparticles: Effect of constraint on the glass-transition temperature of spherical polymer brushes," J. Polym. Sci., Part B Polym. Phys., 40, 2667-2676, (2002).
Scheck et al. "Low relaxation rate in epitaxial vanadium-doped ultrathin iron films," Physical Review Letters, 98, 117601 (2007).
Schoen et al. "Ultra-low magnetic damping of a metallic ferromagnet," Nature Physics, 12, DOI: 10.1038/nphys3770, Sep. 2016.
Silva et al. "Developments in nano-oscillators based upon spin-transfer point-contact devices," Journal of Magnetism and Magnetic Materials, 320, 1260-1271, (2008).
Singamaneni et al. "Magnetic nanoparticles: recent advances in synthesis, self-assembly and applications," Journal of Materials Chemistry, 21, 16819-16845 (2011).

(56) References Cited

OTHER PUBLICATIONS

Slavin et al. "Nonlinear Auto-Oscillator Theory of Microwave Generation by Spin-Polarized Current," IEEE Transactions on Magnetics, 45, 1875-1918 (2009).
Sun et al. "Monodisperse FePt nanoparticles and ferromagnetic FePt nanocrystal superlattices," Science, 287, 1989-1992 (2000).
Thomas et al. "Perpendicular spin transfer torque magnetic random access memories with high spin torque efficiency and thermal stability for embedded applications (invited)," Journal of Applied Physics, 115, 172615 (2014).
Villard et al."A GHz Spintronic-Based RF Oscillator," IEEE Journal of Solid-State Circuits, 45, 214-223, (2010).
Virwani et al. "Controlled removal of amorphous Se capping layer from a topological insulator," Applied Physics Letters, 105, 241605 (2014).
Wang et al. "Nonlinear dynamics induced anomalous Hall effect in topological insulators," Scientific reports, 6, 19803 (2016).
Wang et al. "Proximity-Induced Ferromagnetism in Graphene Revealed by the Anomalous Hall Effect," Physical Review Letters, 114, 016603 (2015).
Wang et al. "Quantum chaotic scattering in graphene systems in the absence of invariant classical dynamics," Physical Review E, 87, 052908 (2013).
Ye et al. "Structural diversity in binary superlattices self-assembled from polymer-grafted nanocrystals," Nature Communications 6, 10052 (2015).
Yu et al. "Quantized Anomalous Hall Effect in Magnetic Topological Insulators," Science, 329, 61-64 (2010).
Yuan et al. "Electron transport in a ferromagnetic/normal/ferromagnetic tunnel junction based on the surface of a topological insulator," The European Physical Journal B, 86, 1-6 (2013).

* cited by examiner

PHASE-LOCKED SPIN TORQUE OSCILLATOR ARRAY

CROSS-REFERENCE TO RELATED APPLICATION

This application is a U.S. National Phase Application of International Patent Application No. PCT/US2017/031292 entitled "PHASE-LOCKED SPIN TORQUE OSCILLATOR ARRAY", filed on May 5, 2017, which claims the benefit of U.S. Provisional Application Ser. No. 62/332,337, entitled "PHASE-LOCKED SPIN TORQUE OSCILLATOR ARRAY" and filed May 5, 2016, both of which are incorporated herein by reference in their entirety.

TECHNICAL FIELD

This invention relates to fabricating magnetic nanoparticle spin torque oscillators (MNP-STOs), MNP-STO devices including MNP-STO arrays, and implementation of MNP-STO devices in applications such as microwave power generation and massively parallel computing.

BACKGROUND

The spin torque oscillator (STO) is a type of microwave device based on the sustained precession of a magnetic moment due to torque transferred from a spin polarized current. A STO has capabilities for high frequency operation (approaching 100 GHz), wide electrical and magnetic tuning range (tens of GHz), small size (down to tens of nm), and compatibility with silicon CMOS and III-V back-end processes.

These attributes make STOs useful for the variety of electrically controlled oscillator applications, such as microwave generator, signal-processing, frequency synthesis integrated circuits (ICs), millimeter-wave high-speed radio links, and cruise control radars. STOs are also useful for the wide range of applications for magnetic field sensors, including highly sensitive, nanoscale read/write heads and biosensors for immunomagnetic assays. In addition, computing with arrays of STOs has attracted much attention recently.

Previously, the application of STOs has been hindered by low output power and poor spectral purity. The previously available STO's output power is limited by its size, which is small (<100 nm) to insure that only a single magnetic domain exists within the structure, thereby providing a well-defined mode of oscillation. Phase noise is inherently high in such STOs due to nonlinearities in the dynamics and sensitivities to thermal magnetic fluctuations, as well as fluctuations in current, field and even oscillation amplitude.

SUMMARY

Methods, devices, and systems for fabricating and implementing nano-oscillator arrays including magnetic nanoparticle spin torque oscillators (MNP-STOs) are described. These MNP-STOs may be used as a basis for microwave power generation massively parallel computing for a wide range of applications. Implementations offer advantages including energy efficiency, ease of fabrication, high density, scalability, design flexibility, robust logic states, and superior data I/O capability.

In general, innovative aspects of the subject matter described in this specification can be embodied in a magneto-electronic device that includes: a surface channel; a source and a drain that are electrically coupled to the surface channel to provide a current through the surface channel; and an array of magnetic nanoparticles in contact with the surface channel, wherein spin torque oscillations in the magnetic nanoparticles are phase-coupled with one another.

Implementations can optionally include one or more of the following features: the magnetic nanoparticles are each composed of a uniform material; the magnetic nanoparticles each include a core of a magnetic material and a shell of a non-magnetic material; the magnetic nanoparticles are spherical; each of the magnetic nanoparticles has a single magnetic domain; the magnetic nanoparticles have their magnetic anisotropy oriented in a substantially same direction; the surface channel is composed of one or more of graphene, $MoS_2$, $WS_2$, $ReS_2$, and a transition metal dichalcogenide; the surface channel is a thin heavy metal layer (e.g., in a range from 5 to 10 nm); the surface channel is composed of a heavy metal; the surface channel is composed of one or more of copper, aluminum, silver, gold, tantalum, tungsten, hafnium, and platinum; spin-polarization in the magnetic nanoparticles is due, at least in part, to a spin-Hall effect in the surface channel; the source produces the current that is non-polarized at the source; the current becomes spin-polarized, as it travels toward the drain, through proximity of the current to the magnetic nanoparticles; the current is spin-polarized by a ferromagnetic contact included in the source; the device further includes a ferromagnetic material, including one or more of a ferromagnetic insulator and a ferromagnetic metal, that is in contact with the surface channel, on a side of the surface channel that is opposite to the array of magnetic nanoparticles; the current becomes spin-polarized, as it travels toward the drain, through proximity of the current to the ferromagnetic material; the surface channel is composed of a topological insulator that provides spin-polarization to the current; the topological insulator is one or more of $Bi_2Se_3$, $Bi_2Te_3$, and $Sb_2Te_3$; the magnetic nanoparticles are phase-coupled with one another due to one or more of a magnetic dipole interaction, an electrical coupling through the current, and exchange coupling through the surface channel; the magnetic nanoparticles are composed of one or more of $Fe_3O_4$, FePt, $CoPt_3$, Ni, Co, and Fe; a majority of the magnetic nanoparticles each have a diameter in a range from 5 to 20 nm; the magnetic nanoparticles are separated from one another by a gap; the gap is in the range of one-tenth to ten times the diameter of the magnetic nanoparticles; and/or the gap is in the range of 1 to 10 nm.

In general, innovative aspects of the subject matter described in this specification can be embodied in a method of forming a magneto-electronic device, the method including: assembling an array of magnetic nanoparticles on a surface channel, wherein each of the magnetic nanoparticles initially coated with an outer shell; and removing the outer shell from the magnetic nanoparticles to bring the magnetic nanoparticles into contact with the surface channel, and to provide a space between the magnetic nanoparticles.

Implementations can optionally include one or more of the following features: the outer shell is composed of an organic material; the outer shell of the magnetic nanoparticles is removed using pyrolysis; assembling the array of magnetic nanoparticles includes drop-casting the magnetic nanoparticles onto the surface channel; the outer shell has a thickness of a single molecule of the material that comprises the outer shell; the array of magnetic nanoparticles is a self-assembled, close-packed array; and/or assembling the array of magnetic nanoparticles includes drop-casting the magnetic nanoparticles onto the surface channel in a spatially uniform magnetic field.

Phase locking of an array of MNP-STOs potentially offers a method to both increase the power and improve the spectral purity. Phase locking can be achieved by: injection locking the oscillators to an external signal; and/or mutual synchronization of coupled oscillators in an array.

Many applications for oscillators in the gigahertz to terahertz range require rapid tunability over wide frequency ranges and/or high spectral purity levels that are beyond the capabilities of conventional oscillator technology. Furthermore, information processing technology has reached a point where performance is severely limited by energy constraints that conventional microprocessor technology is no longer able to address. Novel approaches to microwave signal sources and unconventional approaches to computing involving a paradigm shift in devices, circuits and architecture are required to meet these needs. Implementations described herein provide an array of MNP-STOs that may be used for microwave signal sources, computing, and/or other applications.

In some implementations, a device based on magnetic nanoparticles (MNPs) is driven by spin-polarized surface currents. STOs comprised of MNPs are driven by spin torque (ST) from a spin-polarized surface current. ST from the spin-polarized surface current drives precession of the magnetic moment M. Precession of M in turn induces an oscillation in the resistance and current beneath each MNP, thereby creating a microwave output signal. The phase of the magnetic precession in one MNP can be coupled to others by electrical, dipolar or exchange mechanisms, which can be tailored by chemical design of the MNP composition, size and spacing. In addition, the structure allows global control of electrical coupling through a back-gate electrode and local control of coupling via a 2D optical data input (e.g., for computing applications).

In some implementations, fabrication includes self-assembly a magnetic nanoparticle array by drop-casting suspended MNPs on a conductive surface (such as graphene or other materials mentioned herein) and subsequent patterning of active device regions and electrical contacts by lithography to yield an array of MNPs coupled to a conductive surface channel which is electrically controlled by a bottom gate electrode. Pyrolysis can be used to remove organic shells so as to create electrical contacts between the inorganic MNP cores and the graphene surface channel.

In some implementations, each STO is comprised of a uniform, chemically synthesized, simple, spherical nanoparticle, which couples to current flowing along a surface. Nanoparticle STOs can be precisely organized into highly regular arrays by self-assembly techniques and can be uniformly spaced in close proximity to allow strong electrical and magnetic coupling. The coupling of the nanoparticles to a common surface current is advantageous for driving the oscillations by ST, and for phase locking and data input. The uniform, spherical shape allows the oscillations to be achieved at low currents and with low power dissipation.

Obtaining adequate spin torque to excite STO oscillations at ultra-low drive currents allows low power operation and is facilitated by the ability to synthesize single-domain MNP with sizes near the superparamagnetic limit. A STO is a high-Q oscillator, and the abilities i) to synthesize small, single crystal MNPs (low loss) and ii) to achieve cooperative phase-locking within the array improves robustness to noise. Ultra-low power is possible at least in part because of the small size of the nanoparticle, its spherical shape for minimal shape anisotropy and the low resistance for the CIP/GMR configuration. Scalability to large arrays of MNPs allows high microwave output power and high spectral purity and also enables massively parallel computing is feasible from the ability to self-assemble dense MNP arrays by drop casting and by DNA scaffolding. The tailoring of MNP magnetic moment and interparticle coupling strengths can be precisely controlled by chemical synthesis of nanoparticles with the desired composition, size, and spacing. Fabrication is simplified by the use of a lateral drive current, which allows a simple 2D layout with no upper contacts. The back-gate electrode allows global modulation of electrical coupling between elements, which can be used for RF phase locking. In addition, top (or back-side) illumination can serve to control local carrier density and coupling strengths, thereby providing a means for 2D programming and data input to the array.

Thus, particular embodiments have been described. Variations, modifications, and enhancements of the described embodiments and other embodiments can be made based on what is described and illustrated. In addition, one or more features of one or more embodiments may be combined. The details of one or more implementations and various features and aspects are set forth in the accompanying drawings, the description, and the claims below.

DETAILED DESCRIPTION

Unlike CMOS and other conventional circuitry, the logic states in oscillator schemes are represented dynamically by phase (or frequency), and the gates must dissipate dynamic power to hold the state. Thus, energy efficient computing is feasible for oscillators with ultra-low power dissipation, which implies nanoscale oscillators based on an energy-efficient physical mechanism.

Figure 1:
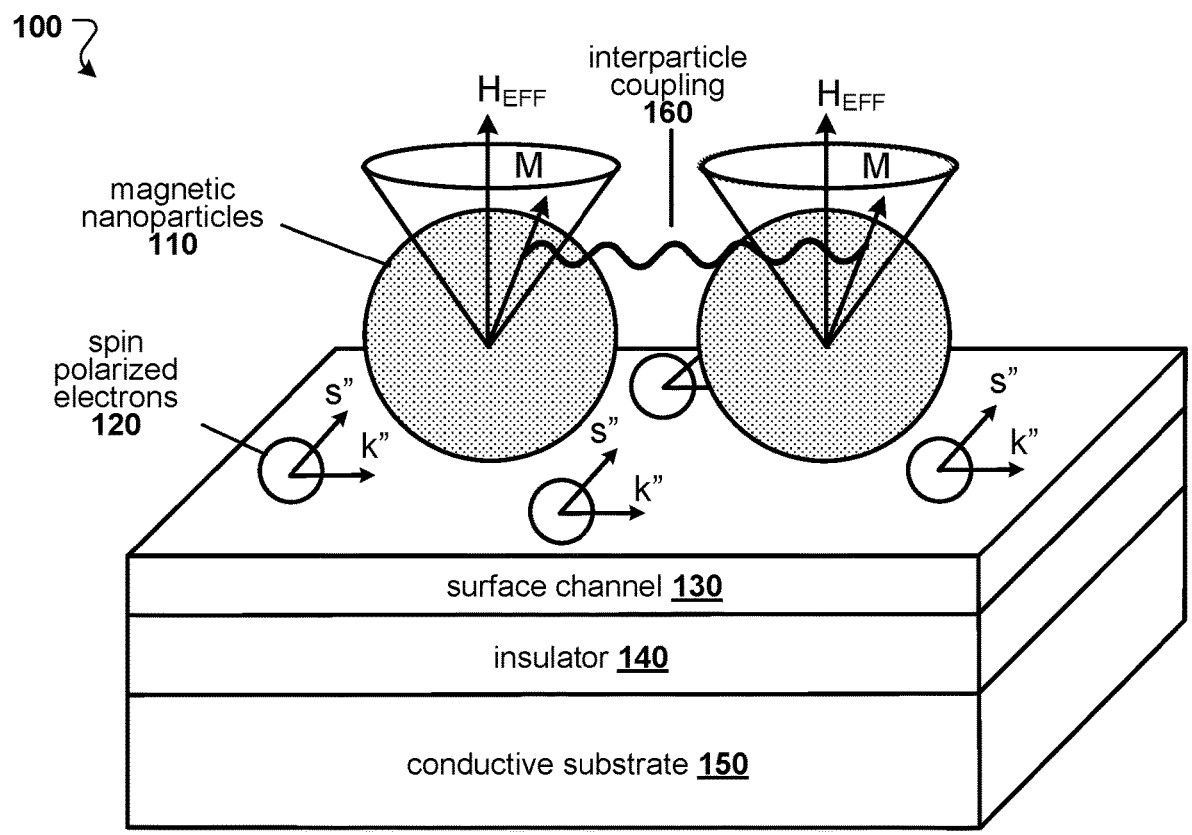
FIG. 1 depicts MNP-STOs with in-plane current (CIP).

FIG. 1 depicts an example system 100, including an array of MNP-STOs 110 with in-plane current (CIP) including spin polarized electrons 120. The MNP-STOs are arranged on a surface channel 130, and an insulator layer 140 is arranged between the surface channel 130 and a conductive substrate 150. Through an interparticle coupling 160, a magnetic coupling between the MNP-STOs, the spin torque oscillations in the MNPs are phase-coupled to one another. Stated somewhat differently, the electrical phase of spin torque oscillations in the MNPs are coupled to one another. This phase-coupling is due to a magnetic dipole interaction between the MNPs. The phase coupling may also be due to an electrical coupling through the CIP and/or an exchange coupling through the surface channel.

FIG. 1 depicts spin torque oscillators (STOs) based on magnetic nanoparticles (MNPs) driven by spin-polarized surface currents. As described herein, nano-oscillator arrays including MNP-STOs may be used as a basis for microwave oscillators having enhanced output power and high spectral purity and for massively parallel computing for demanding tasks such as pattern recognition and image processing. Spin torque (ST) underlies magnetization oscillations in spin torque oscillators (STOs). For ultra-low power, minimal voltage and current are desired. The voltage drop can be reduced or minimized by using a giant magnetoresistance (GMR) configuration with conducting layers. Current can be reduced or minimized by using spherical nanoparticles as the active precessing magnetic element, thereby decreasing the size of each STO and also eliminating the large shape anisotropy, thus decreasing the spin torque required for oscillation.

Figure 2:
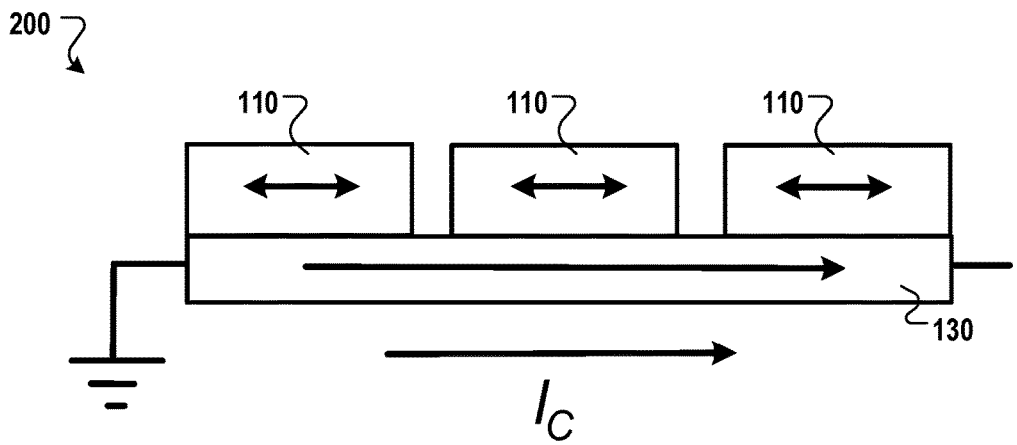
FIG. 2 depicts a schematic of phase-locked magnetic nanoparticle spin torque oscillators (MNP-STOs).

An exemplary configuration that demonstrates these features is depicted in FIG. 1. As depicted, spin-polarized electrons in the surface channel impart torque to the magnetic elements by scattering from the interface. The configuration in FIG. 1 also allows electrical coupling of individual STOs to be achieved in a simple, compact layout by the series connection of elements in a close packed array, as illustrated in FIG. 2. FIG. 2 shows another example schematic 200 of phase-locked MNP-STOs 110, arranged in a close packed array on the surface channel 130. As described herein, electrical coupling is one of several mechanisms for coupling phase information between STOs.

STOs comprised of MNPs are driven by spin torque (ST) from a spin-polarized surface current. In the example depicted in FIG. 1, the effective field $H_{eff}$ of the MNP is oriented perpendicular to the plane. The effective field may also be due to anisotropy or an external field. In some examples, tuning may be accomplished through the external field. ST from the spin-polarized surface current drives precession of the magnetic moment M. Precession of M in turn induces an oscillation in the resistance and current beneath each MNP, thereby creating a microwave output signal. The phase of the magnetic precession in one MNP is coupled to others by electrical, dipolar, and exchange mechanisms, which can be tailored by physical design. In addition, the structure allows global control of electrical coupling through a back-gate electrode and local control of coupling via a 2D optical data input.

Microwave oscillators with enhanced output power and spectral purity may be achieved through phase locking of a large number of coupled MNP-STOs in an array. Output power and spectral purity scale with the number of phase locked oscillators, which can be many millions and more for MNP-STOs.

Energy efficient computing may be achieved by using the coupling of phase information among STOs in an MNP array. Some features and advantages of MNP-STOs for energy efficient computing are summarized in Table 1. Obtaining adequate spin torque to excite STO oscillations at ultra-low drive currents is essential for low power, and this is made possible by the ability to synthesize single-domain MNP with sizes near the superparamagnetic limit. An STO is potentially a high-Q oscillator. Robustness to noise may be improved by the abilities to synthesize small, single crystal MNPs (low loss) and to achieve cooperative phase-locking within the array. Ultra-low power is possible at least in part because of the small size of the nanoparticle, its spherical shape for minimal shape anisotropy and the low resistance for the in-plane current/giant magnetoresistance (CIP/GMR) configuration. Scalability to massively parallel computing is achieved via self-assembly of dense MNP arrays by drop casting and DNA scaffolding methods known in the art. The tailoring of MNP magnetic moment and interparticle coupling strengths can be precisely controlled by chemical synthesis of nanoparticles with the desired composition, size, and spacing. Fabrication is simplified by the use of a lateral drive current, which allows a simple 2D layout with no upper contacts. The back-gate electrode allows global modulation of electrical coupling between elements, which can be used for RF phase locking. In addition, top (or back-side) illumination can serve to control local carrier density and coupling strengths, thereby providing a means for 2D programming and data input to the array. Some details of the advantages in density, oscillation coherence and data I/O are given below.

TABLE 1

Exemplary features and advantages of NMP-STO computing applications.

| Feature | Advantage |
|---|---|
| small MNP → small M → nearly superparamagnetic → | adequate STT with ultra-low I |
| single crystal MNP → low loss → high Q → | robust to noise |
| CIP/GMR → low R → small V → | ultra-low power |
| self-assembled → high density → tailorable MNP material, size, spacing → | scalable to massively parallel controllable M and coupling |
| lateral drive current → 2D layout → | simple fabrication |
| back-gate → global coupling control → | RF phase locking (pump ref) |
| optical input → control of local coupling → | 2D data input |

Higher density: Implementations provide for a higher density of MNP-STOs in an array, compared to the density that is achievable using traditional lithographic methods. Self-assembly allows the fabrication of highly uniform MNP arrays at sub-lithographic dimensions. Highly uniform arrays of close-packed MNPs with ~5-20 nm diameter cores and 1-10 nm thick shells can be fabricated easily and inexpensively over large areas by self-assembly. The control of the gap between inorganic cores by the thickness of the shells also enables the electrical, dipolar, and exchange coupling to be varied over wide ranges, allowing optimization of the local and collective interactions within the array.

Oscillation coherence: Implementations also provide for greater oscillation coherence than is achievable using traditional techniques. Chemically synthesized MNPs are highly uniform (<5%) and comparable in size to the magnetization exchange length (~5-10 nm). This provides advantages over larger patterned nanomagnets for achieving coherent and uniform oscillations. In addition, virtually each nanoparticle is a single crystal so that material defects are less likely to degrade the oscillations. The nanoparticles are substantially spherical, so that the demagnetizing fields are substantially uniform throughout the particle and they have nearly zero shape anisotropy, which also makes uniform magnetization precession easier to attain. The suppression of multiple oscillation modes in the individual MNP-STOs enhances the collective behavior in phase-locked arrays.

In contrast, conventional patterned devices are polycrystalline and prone to disorder from process-induced rough edges, both of which create a greater variation in magnetic properties. Flat magnetic films also have highly non-uniform demagnetizing fields, especially near the device edges, greatly increasing the likelihood of unwanted complex modes of oscillation.

Data input/output capabilities: Implementations enable data storage with data input/output capabilities that are an improvement over traditional systems. While data I/O in a 2D array can be envisioned as entering and exiting from the edges of the array with the computation taking place by local interactions within the array, the capability for addressing internal points in the array is desirable. The simple structure of an MNP-STO array, which eliminates shadowing by surface electrodes, is attractive for 2D optical access via both front-side and back-side illumination. Illumination could be used to spatially modulate the carrier density in a surface channel (e.g., graphene or $MoS_2$) and thereby control the local interparticle electrical coupling strengths as a means for 2D data input and/or programming. The ability to self-assemble superlattice arrays comprised of two or more species of nanoparticles with different electrical, magnetic, and optical properties may also facilitate 2D I/O by optical techniques. In addition, time-resolved magneto-optical near-field imaging and readout of the array is possible, optical manipulation of magnetic properties has been demonstrated on a scale of 10 nm. Thus, computing using MNP STOs driven by in-plane spin-polarized surface currents offers advantages for fabrication simplicity, density scalability, design flexibility, logic state robustness, and data I/O capability, as well as ultra-low power consumption.

Figure 3:
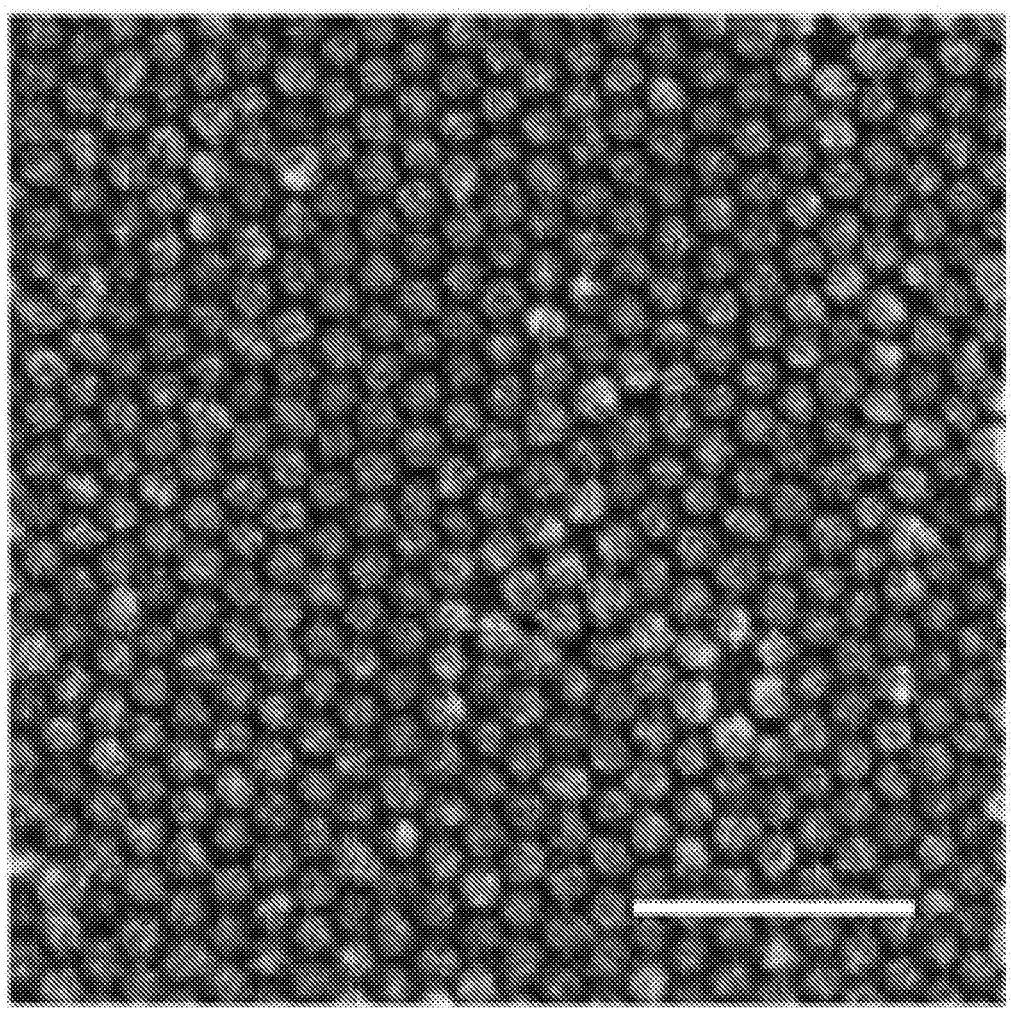
FIG. 3 is a scanning electron micrograph (SEM) image of 18-nm $Fe_3O_4$ MNPs self-assembled on graphene.

In some implementations, a device includes a $Fe_3O_4$ MNP array that is self-assembled on a graphene layer on an $SiO_2$-on-silicon substrate. A topographical atomic force microscopy (AFM) image 300 of such a MNP array is shown in FIG. 3. In this instance, electronic coupling between the MNPs and graphene was confirmed by conductive-AFM measurements. Magnetic coupling between the MNPs and the graphene was confirmed by Hall measurements on back-gated van der Pauw devices.

Figure 4:
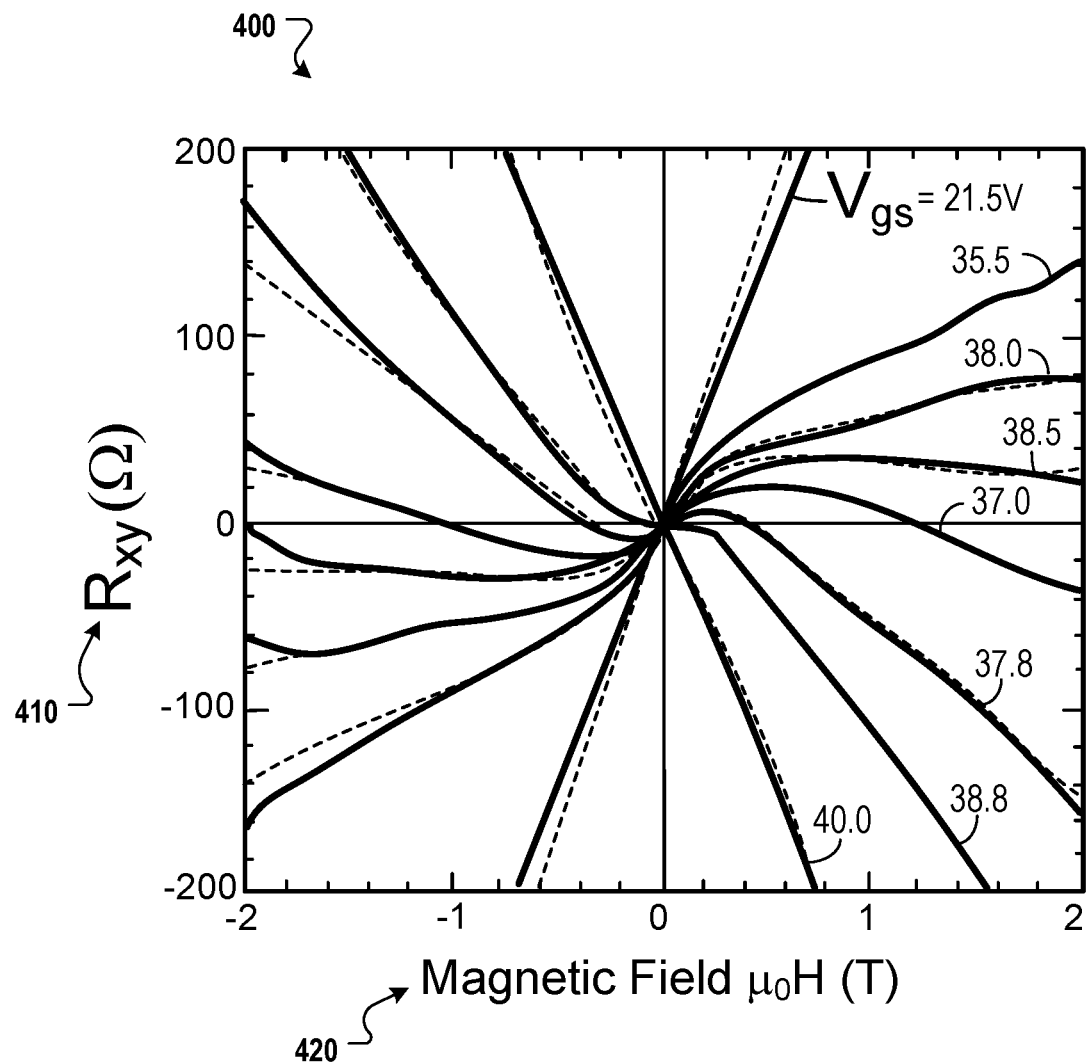
FIG. 4 shows Hall resistance versus magnetic field for a $Fe_3O_4$ MNP array on graphene at various gate biases. Nonlinearities are signatures of the anomalous Hall effect, which is attributed to proximity induced ferromagnetism in the graphene from coupling to the MNP array

FIG. 4 shows a graph 400 of Hall resistance 410 versus magnetic field 420 for an example Fe3O4 MNP array on graphene at various gate biases. Nonlinearities are signatures of the anomalous Hall effect, which is attributed to proximity induced ferromagnetism in the graphene from coupling to the MNP array.

The Hall data is shown in FIG. 4 for different values of back-gate bias $V_{gs}$. Variations in the slope in the figure reflect differences in the electron and hole densities for different biases near the Dirac point. The striking nonlinearities in $R_{xy}$ vs H, which are normally not seen for graphene, are a signature of the anomalous Hall effect (AHE). This shows that the graphene in the device exhibits ferromagnetic properties due to coupling with the MNP array, and therefore shows, by conservation of angular momentum, that the electron current in the graphene exerts the desired spin torque on the magnetic moment of the MNP.

As described herein, MNP STOs operate at ultra-low power levels for energy efficiency, exhibit high Q factors for robustness to noise, and demonstrate lower power dissipation than conventional STOs. In addition, unlike conventional STOs, MNP-STOs generally do not require a large magnetic bias field to be applied for oscillations. The critical current $I_c$ required for spin torque oscillation in a magnetic particle is approximately given by:

$$I_c \geq \left(\frac{e}{\hbar}\right)\left(\frac{\alpha}{\varepsilon}\right)\mu_0 M_s V H_{eff}$$

where e is the electron charge, h is Planck's constant divided by $2\pi$ (h-bar), $\alpha$ is the Gilbert damping constant, $\varepsilon$ is the spin polarization, $M_s$ is the free layer saturation magnetization, V is the particle volume, and $H_{eff}$ is the effective field acting on the particle. A spherical magnetic nanoparticle has shape anisotropy by symmetry, therefore $H_{eff}$ will only include contributions from the intrinsic magnetic anisotropy (crystalline or from pair-ordering), dipolar interactions from other particles, and any externally applied field. The oscillator operating frequency $f_0$ determines the required $H_{eff}$, through $f_0=(\gamma/2\pi)\mu_0 H_{eff}$ where $\gamma$ is the gyromagnetic ratio. For $f_0=1$ GHz, then $H_{eff}\sim 350$ Oe. For graphene in a CIP device, where R~1 k$\Omega$/sq, with a nanoparticle diameter of d=5 nm, $M_s$=400 kA/m, and a damping $\alpha$=0.01, then a power density of P~10 W/cm$^2$ is estimated. If instead of graphene, a metal is used in the CIP device with R~1 $\Omega$/sq, then the device can operate at $f_0$=10 GHz with $H_{eff}\sim 3500$ Oe and have P~1 W/cm$^2$, all other parameters being the same.

For comparison, a conventional nanopillar STO patterned lithographically will have a typical minimum size of d~50 nm, which is ~10× larger than a 5-nm nanoparticle. Since the critical current $I_c \propto d^2$ the power will be $P \propto I_c^2 \propto d^4 \sim 10^4 \times$ larger for the nanopillar, and the power density ~$10^2 \times$ larger. In addition, the most common nanopillar/nanocontact STOs require large bias fields ~$B_s$ to overcome the out-of-plane anisotropy caused by the thin film demagnetizing field. This bias field is needed in addition to any field required for setting $f_0$. Thus, nanoparticle STOs are expected to have lower power and simpler operation than previously STOs.

A high Q-factor is desired for robustness to noise. The theoretical linewidth of an STO was shown to be $$\Delta f \sim \lambda \frac{k_b T}{E_{osc}},$$

where $\lambda$ is the Landau-Lifshitz damping parameter, $k_b$ is Boltzmann's constant, T is temperature and $E_{osc}$ is the energy of the oscillator. For typical nanopillars, $E_{osc} \sim M_s VH_{eff} \sim 50\text{-}100\ k_b T$ at room temperature, giving $$Q = \frac{f_0}{\Delta f} \sim \frac{1}{\alpha}\frac{E_{osc}}{k_b T} \sim 1000 - 10000.$$

Since a nanoparticle is much smaller in volume and $E_{osc} \sim k_b T$, the linewidth of an individual nanoparticle oscillator is understood to be somewhat broad with $Q \sim 1/\alpha \sim 100$. However, when N oscillators phase-lock, there is a corresponding narrowing of the linewidth by a factor ~1/N, so that $Q \sim N/\alpha$. This narrowing occurs since $E_{osc}$ is effectively N times larger for the phase locked oscillators. Such linewidth narrowing has been observed for two nanocontact oscillators, with a reduction in linewidth of >2× after phase-locking. Thus, an array of N phase-locked nanoparticle oscillators is expected to demonstrate a narrower linewidth and a higher associated Q, thereby providing increased stability and robustness to noise.

The Q of individual MNP STOs can also be significantly increased by using magnetic materials with lower damping constant $\alpha$. Typical STO free layers such as NiFe and CoFeB alloys have $\alpha$~0.01. However, certain Fe—V and CoFe alloys have been found to have much lower damping (3×-5×) and are therefore suitable for high Q nanoparticle oscillators.

Figure 5:
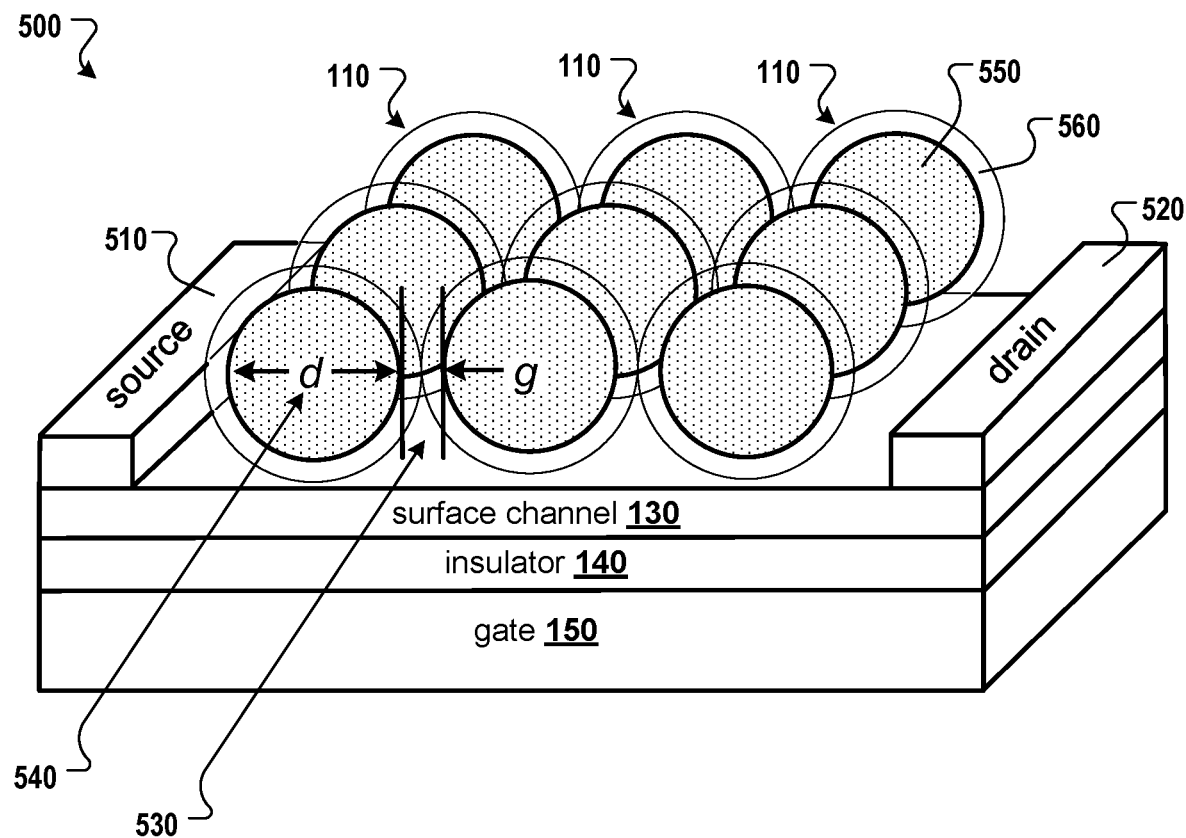
FIG. 5 depicts an exemplary MNP-STO array.

FIG. 5 depicts an exemplary MNP-STO array 500. As shown in the example of FIG. 5, the surface channel 130 may be electrically coupled to a source 510 and a drain 520, such that the current flows from the source to the drain through the surface channel.

In implementations illustrated by FIG. 5, the MNP-STOs 110 include a core 550, of a diameter (d) 540, and a shell 560 that has a tunable thickness based on the chemical composition and creation of the STOs. In some implementations, the STOs 110 may be deposited onto the surface channel in a close packed array such that the shells of the STOs are in contact with each other. Accordingly, the cores 550 may be separated from one another by a gap (g) 530 that is twice the thickness of the shell 560. In implementations that employ such a core-shell design for the STOs, the core may be a different material than the shell. For example, the core is a magnetic material, and the shell is a non-magnetic material. Alternatively, the STOs may be composed of a single, magnetic material, as shown in FIG. 1.

Oscillations of the MNP magnetization are driven by coupling between the MNP and spin-polarized surface currents. The following exemplary implementation are described with reference to the device structure in FIG. 5 and to nonmagnetic (NM) and ferromagnetic (FM) contacts:

1. NM source and NM drain contacts. In this implementation, an unpolarized electron current injected from the source becomes spin polarized as it travels toward the drain due to proximity induced ferromagnetism due to coupling to the MNP array. Thus, spin polarization induced by MNPs near the source provides ST to drive oscillations farther downstream.
2. FM source and NM drain contacts. Similar to (1) but the current is already spin-polarized by the FM source contact as it is injected into the device.
3. NM source and NM drain contacts with an underlying FM coupling layer. Here, spin polarization is induced continuously along the channel by proximity induced ferromagnetism from an adjacent insulating FM thin film, such as a YIG layer.
4. NM source and NM drain contacts to a spin polarized channel created by the surface states of a topological insulator, e.g., $Bi_2Se_3$. In this case, spin-momentum locking via the topological surface states provides spin-polarization continuously along the channel.
5. NM source and NM drain contacts to a spin polarized channel comprised of a heavy metal such as Tantalum in which carriers of one spin accumulate on the surface of the metal due to the spin Hall effect.

Phase coupling mechanisms: In addition to a means for driving the oscillations, computing with STOs include a means for coupling phase information among oscillators, both locally (for data processing) and globally (for data reference). MNP-STO arrays provide three mechanisms for coupling the magnetic-precession: 1) electrical coupling (current modulation due to magnetoresistance oscillations in the vicinity of each STO); 2) magnetic dipole interaction (magnetostatic coupling between adjacent or nearby STOs); 3) exchange coupling (RKKY interactions via the surface electrons).

MNP array design: While all three coupling mechanisms are accessible by MNP-STOs, the small size and close proximity of MNP-STOs, together with their precise tailorability by chemical synthesis, make this approach uniquely suited to controlling dipole and exchange interactions for optimizing phase locking. State-of-art chemical synthesis of functional inorganic nanoparticles allows the precise choice of composition, core diameter and organic shell thickness, which in turn allows precise design of magnetization, anisotropy, size and interparticle gaps in self-assembled arrays. Arrays comprised of MNPs with cores in the 5-20 nm diameter range and shells with thicknesses in the 1-10 nm range are studied.

Implementations provide for design optimization and frequency tunability. The $H_{eff}$ for the MNPs can be optimized by tailoring anisotropy (shape, magnetocrystalline) and orientation (e.g., self-assembly in a magnetic field) to provide stable operation at room temperature without an external magnetic field. Additionally, the ability to vary $H_{eff}$ with an external field may be exploited for tuning the oscillation frequency. Frequency tuning by current bias can also be used.

With regard to the chemical synthesis of NMPs, implementations use nanoparticles of tunable size, shape and properties (magnetic, electrical, optical) that can be processed into ordered 2-D arrays in a highly modular fashion. Well-defined nanoscopic building blocks are created via "bottom up" wet-chemical synthetic methods. Well-defined metallic nanoparticles with tunable sizes from 5-20 nm can be synthesized using established methods, including FePt and other magnetic alloy NPs in the ranges of 5-10 nm are also synthesized. Phosphonic acids ligands with tunable lengths (e.g., alkyl segments from 6-18 carbons and polymer ligands with 10-50 units) enable control of interparticle spacing over a wide range in 2D MNP arrays. The ability to control the ligand surface chemistry of magnetic NPs is advantageous.

The synthesis of heterostructured magnetic colloids, with controllable placement of noble metal inclusions in the core, or outer shell of superparamagnetic NPs can be implemented to enhance the electrical properties of these materials in magneto-electronic devices.

In some implementations, the surface channel is composed of graphene-based structures or other suitable conductive materials. Alternatively, a topological insulator (TI) such as $Bi_2Se_3$ is used to provide a spin-polarized surface channel. TIs have the advantage of fully spin-polarized charge carriers in the topological surface state (TSS), which persists at room-temperature. Their spin is locked to their momentum and TSS electrons appear in counter-propagating pairs. MBE allows for the precise control of the TI film thickness and the (low-temperature) growth has been established on a number of crystalline and also amorphous substrates, allowing growth on $SiO_2$/Si wafers. This leads to 1D or 2D, fully spin-polarized surface conduction channels in the vicinity of the MNPs; and, depending on the MNP array design, to various MNP coupling regimes and macroscopic, spin-polarized states. This will promote the coupling of the STOs, reducing the required power for their operation.

The fabrication of devices, according to the implementations described herein, makes use of the chemical protocols and fabrication processes in which electrical and magnetic coupling (as shown in FIG. 4) occurs between (e.g., $Fe_3O_4$) MNP arrays (as shown in FIG. 3) and a (e.g., graphene) surface channel on a (e.g., $SiO_2$-on-silicon) substrate. For example, self-assembled arrays can be formed by drop-casting 18-nm $Fe_3O_4$ with 2-nm oleic acid shells dispersed in hexane. In some implementations, pyrolysis is used to remove organic ligands on the MNP surfaces and create electrical contact between the (e.g., $Fe_3O_4$) cores of the MNPs and the surface channel (e.g., graphene layer).

In some implementations, the array of MNP-STOs may be used, e.g., as a microwave oscillator, to generate a microwave output signal. The spin torque oscillation in the nanoparticles create an oscillating resistance in the surface channel due to spin-dependent electron scattering, which in turn causes an oscillating current in the channel, thereby giving rise to a microwave output signal.

The direction of the magnetization of the particles and the direction of the electron spin in the channel may be perpendicular with respect to each other. In some instances, the nanoparticle magnetization is oriented perpendicular to the surface, and the electron spin is oriented parallel to the surface. In some instances, the nanoparticle magnetization is oriented parallel to the surface, and the electron spin is oriented perpendicular to the surface. Similarly, the direction of the magnetization in the ferromagnetic contact or ferromagnetic insulator/metal layer may be oriented perpendicularly to the nanoparticle magnetization.

Implementations provide a magneto-electronic device that includes an array of MNPs that is a self-assembled structure. In some implementations, the MNPs are spherical, or substantially spherical. The MNPs may be arranged in an array that is a single, two-dimensional layer on the surface channel. In some implementations, the MNPs may be uniformly composed particles that are composed of the same material throughout each MNP. Alternatively, the MNPs may have a magnetic core and a non-magnetic shell. In such instances, the shell may be electrically conductive to provide an electrical contact with the surface channel. The MNPs may be small enough to have a single magnetic domain. The MNPs are phase-locked in their oscillation.

In some implementations, the surface channel is conductive, e.g., composed of graphene, $MoS_2$, a transition metal dichalcogenide, or some other conductive material. The surface channel provides a medium for coupling the MNPs electrically and/or through an exchange interaction. The coupling may also be through magnetic dipole coupling. The current in the surface channel may drive the spin torque oscillation, and the current may in some cases be spin-polarized to provide the spin-polarization to the MNPs.

The coupling between the MNPs may be provided by one or more of the following: magnetic dipole coupling between MNPs, through a magnet dipole field; electrical coupling through the current flowing in surface channel (e.g., magnetoresistance coupling); and/or exchange interaction, as a quantum mechanical coupling mechanism that occurs through the surface current. The separation between the MNPs can be tuned (e.g., through the thickness of a persistent shell of the MNPs, or through the thickness of the organic layer that is removed following placement of the MNPs) to tailor the interaction strength for each of these types of coupling.

Spin torque oscillation may be applied to the MNPs through one of the following techniques:
1. The current is sourced such that the electrons are not initially spin-polarized. Spin polarization of the electrons results from their scattering off MNPs that are themselves spin polarized, such that the current gains a spin polarization as it travels from the source to drain.
2. The source electrode that is producing the electrons for the current is composed of a ferromagnetic material, and/or there is a ferromagnet in contact with the source, such that the current passing through the source only includes one spin polarization. Thus, an electron enters the channel spin-polarized, and transfers its spin-polarization to the MNPs.
3. A ferromagnetic material may be included between the insulator and the surface channel, or the insulator is a ferromagnetic insulator (e.g., YIG), such that the electrons pick up spin polarization from the ferromagnetic material and/or insulator.
4. The surface channel is made of a topological insulator (TI), e.g., $Bi_2Te_3$, $Bi_2Se_3$, that is primarily insulating but has special surface topological properties that provide spin polarization to the electrons in the surface channel.

Implementations can employ MNPs that are synthesized using various suitable methods. In some implementations, the MNPs are synthesized with an organic shell, such as a shell of Oleic acid, 1 nm thick. The solution used during synthesis may prevent the MNPs from sticking together. The MNPs may be drop-cast onto the surface channel, and the shell provides for uniform spacing of the MNPs that are close-packed on the surface. In some implementations, the shell has a one molecule thickness. The shell may be removed following the drop-casting, through a pyrolytic process (e.g., heating) that degrades and vaporizes the shell, or other suitable technique. Removing the shell causes the MNPs to contact the surface channel, and provides for a uniform spacing between MNPs. In this way, the assembly of the array may be a self-assembly, such leaves the MNPs close-packed on the surface in a single layer, separated by a uniform gap (e.g., approximately twice the thickness of the removed shell). The close packing of the MNPs provides for a strong magnetic dipole coupling between the magnetic fields of the individual particles. The close packing also facilitates the coupling through the current in the surface.

Implementations provide for a stronger coupling between MNPs, compared to traditional systems of coupled particles, and thus provides for an array of MNP-STOs that is less prone to noise due to the small size of the MNPs, their spherical symmetry, and their closeness. The strongly coupled array of MNP-STOs may be employed as a microwave oscillator. The phase-locking MNPs allows for a multiplication of the power output of the oscillator, which scales as the square of the number of MNPs in phase lock. The uniformity of the array, and the strong coupling between particles, leads to a high purity of the oscillator that provides output at a single frequency with minimal noise. The oscillator is highly tunable, with high spectral purity and high power, and thus is an improvement over previously available microwave oscillators.

Implementations also provide an array of MNP-STOs that may be employed as an analog computer, where information is represented by the phase of the particles, and the phase coupling enables the performance of computations. To program the array, the coupling between MNPs may be modified locally through use of an optical signal that is projected onto the surface to modify certain couplings based on intensity of optical signal at different points. In this way, the array may be employed for associative, non-Boolean computing.

Further modifications and alternative embodiments of various aspects will be apparent to those skilled in the art in view of this description. Accordingly, this description is to be construed as illustrative only. It is to be understood that the forms shown and described herein are to be taken as examples of embodiments. Elements and materials may be substituted for those illustrated and described herein, parts and processes may be reversed, and certain features may be utilized independently, all as would be apparent to one skilled in the art after having the benefit of this description. Changes may be made in the elements described herein without departing from the spirit and scope as described in the following claims.

What is claimed is:

1. A magneto-electronic device comprising:
   a surface channel;
   a source and a drain that are electrically coupled to the surface channel to provide a current through the surface channel; and
   an array of magnetic nanoparticles in contact with the surface channel, wherein spin torque oscillations in the magnetic nanoparticles are phase-coupled with one another.

2. The magneto-electronic device of claim 1, wherein the magnetic nanoparticles are each composed of a uniform material.

3. The magneto-electronic device of claim 1, wherein each of the magnetic nanoparticles includes a core of a magnetic material and a shell of a non-magnetic material.

4. The magneto-electronic device of claim 1, wherein the magnetic nanoparticles are spherical.

5. The magneto-electronic device of claim 1, wherein each of the magnetic nanoparticles has a single magnetic domain.

6. The magneto-electronic device of claim 1, wherein the magnetic nanoparticles have their magnetic anisotropy oriented in a substantially same direction.

7. The magneto-electronic device of claim 1, wherein the surface channel is a thin heavy metal layer in a range from 5 to 10 nm.

8. The magneto-electronic device of claim 1, wherein spin-polarization in the magnetic nanoparticles is due, at least in part, to a spin-Hall effect in the surface channel.

9. The magneto-electronic device of claim 1, wherein:
the source produces the current that is non-polarized at the source; and
the current becomes spin-polarized, as it travels toward the drain, through proximity of the current to the magnetic nanoparticles.

10. The magneto-electronic device of claim 1, further comprising:
a ferromagnetic material, including one or more of a ferromagnetic insulator and a ferromagnetic metal, that is in contact with the surface channel, on a side of the surface channel that is opposite to the array of magnetic nanoparticles,
wherein the current becomes spin-polarized, as it travels toward the drain, through proximity of the current to the ferromagnetic material.

11. The magneto-electronic device of claim 1, wherein the surface channel is composed of a topological insulator that provides spin-polarization to the current.

12. The magneto-electronic device of claim 1, wherein the magnetic nanoparticles are phase-coupled with one another due to one or more of a magnetic dipole interaction, an electrical coupling through the current, and exchange coupling through the surface channel.

13. The magneto-electronic device of claim 1, wherein the magnetic nanoparticles are separated from one another by a gap that is in the range of one-tenth to ten times a diameter of the magnetic nanoparticles.

* * * * *